(12) United States Patent
Shih

(10) Patent No.: US 9,177,909 B2
(45) Date of Patent: Nov. 3, 2015

(54) SEMICONDUCTOR CAPACITOR

(71) Applicant: UNITED MICROELECTRONICS CORP., Hsin-Chu (TW)

(72) Inventor: Hsueh-Hao Shih, Hsinchu (TW)

(73) Assignee: UNITED MICROELECTRONICS CORP., Science-Based Industrial Park, Hsin-Chu (TW)

( * ) Notice: Subject to any disclaimer, the term of this patent is extended or adjusted under 35 U.S.C. 154(b) by 225 days.

(21) Appl. No.: 13/966,294

(22) Filed: Aug. 14, 2013

(65) Prior Publication Data

US 2015/0048482 A1 Feb. 19, 2015

(51) Int. Cl.
  *H01L 21/02* (2006.01)
  *H01L 23/522* (2006.01)
  *H01L 49/02* (2006.01)

(52) U.S. Cl.
  CPC ............ *H01L 23/5223* (2013.01); *H01L 28/88* (2013.01); *H01L 28/90* (2013.01); *H01L 2924/0002* (2013.01)

(58) Field of Classification Search
  CPC ....................................................... H01L 49/02
  USPC ........................................................... 257/532
  See application file for complete search history.

(56) References Cited

U.S. PATENT DOCUMENTS

| | | | |
|---|---|---|---|
| 4,409,608 A | 10/1983 | Yoder | |
| 4,929,998 A | 5/1990 | Boudewijns | |
| 5,208,725 A | 5/1993 | Akcasu | |
| 5,583,359 A | 12/1996 | Ng | |
| 5,978,206 A | 11/1999 | Nishimura | |
| 6,600,209 B1 | 7/2003 | Kang | |
| 6,653,681 B2 | 11/2003 | Appel | |
| 6,743,671 B2 | 6/2004 | Hu | |
| 6,819,542 B2 * | 11/2004 | Tsai | H01L 23/5223 257/E21.015 |
| 6,949,781 B2 | 9/2005 | Chang | |
| 6,980,414 B1 | 12/2005 | Sutardja | |
| 7,348,624 B2 * | 3/2008 | Sakaguchi | H01L 23/5223 257/296 |
| 7,990,676 B2 * | 8/2011 | Topaloglu | H01G 4/232 361/302 |
| 7,994,610 B1 * | 8/2011 | Quinn | H01L 23/5223 257/532 |
| 8,014,124 B2 | 9/2011 | Lin | |
| 9,064,841 B2 * | 6/2015 | Huang | H01L 23/5223 1/1 |
| 2005/0161725 A1 * | 7/2005 | Da Dalt | H01L 23/5222 257/306 |
| 2008/0128857 A1 * | 6/2008 | Bi | H01L 23/5223 257/532 |
| 2013/0148258 A1 * | 6/2013 | Chen | H01L 23/5223 361/303 |

OTHER PUBLICATIONS

Hired Samavati et al, "Fractal Capacitors," IEEE Journal of Solid-State Circuits, vol. 33, No. 12, Dec. 1998.

* cited by examiner

*Primary Examiner* — Shaun Campbell
*Assistant Examiner* — Ismail Muse
(74) *Attorney, Agent, or Firm* — Winston Hsu; Scott Margo

(57) ABSTRACT

A semiconductor capacitor is includes a substrate, a plurality of odd layers formed on the substrate, and a plurality of even layers formed on the substrate. Each odd layer includes a plurality of first odd fingers and a first odd terminal electrically connected thereto, and a plurality of second odd fingers and a second odd terminal electrically connected thereto. Each even layer includes a plurality of first even fingers and a first even terminal electrically connected thereto, and a plurality of second even fingers and a second even terminal electrically connected thereto. The semiconductor capacitor further includes at least a first odd connecting structure electrically connecting the first odd terminals, at least a second odd connecting structure electrically connecting the second odd terminals, at least a first even connecting structure electrically connecting the first even terminals, and at least a second even connecting structure electrically connecting the second even terminals.

8 Claims, 5 Drawing Sheets

SEMICONDUCTOR CAPACITOR

BACKGROUND OF THE INVENTION

1. Field of the Invention

The present invention relates to a semiconductor structure, and more particularly, to a semiconductor capacitor structure.

2. Description of the Prior Art

In modern integrated circuits (ICs), capacitors are prevalently used to achieve different functions such as dynamic random access memories, bypassing, and filters. In typical analog IC processes, the capacitors are constructed by sandwiching a dielectric material between two conductive materials. For example, the capacitors usually used in the art include the metal-insulator-metal (MIM) capacitor and the metal-oxide-metal (MOM) capacitor.

Capacitances of the capacitors are very sensitive to the fabrication process and structure design. Accordingly, a variance of capacitance caused by misalignment is always unwanted. Therefore it is desirous to reduce variation in the structure and obtain a higher capacitance for the semiconductor capacitors.

SUMMARY OF THE INVENTION

According to an aspect of the present invention, a semiconductor capacitor is provided. The semiconductor capacitor includes a substrate, a plurality of odd layers formed on the substrate, and a plurality of even layers formed on the substrate. The substrate includes a capacitor region, a terminal region, and a peripheral region defined thereon. Each odd layer includes a plurality of first odd fingers formed in the capacitor region, a plurality of second odd fingers formed in the capacitor region, a first odd terminal formed in the terminal region, and a second odd terminal formed in the terminal region. The first odd fingers and the second odd fingers are interdigitated with each other and physically and electrically isolated from each other in the capacitor region. The first odd fingers are electrically connected to the first odd terminal, and the second odd fingers are electrically connected to the second odd terminal. Each even layer includes a plurality of first even fingers formed in the capacitor region, a plurality of second even fingers formed in the capacitor region, a first even terminal formed in the terminal region, and a second even terminal formed in the terminal region. The first even fingers and the second even fingers are interdigitated with each other and physically and electrically isolated from each other in the capacitor region. The first even fingers are electrically connected to the first even terminal, and the second even fingers are electrically connected to the second even terminal. The semiconductor capacitor further includes at least a first odd connecting structure formed in the terminal region for electrically connecting the first odd terminals in the odd layers, at least a second odd connecting structure formed in the terminal region for electrically connecting the second odd terminals in the odd layers, at least a first even connecting structure formed in the terminal region for electrically connecting the first even terminals in the even layers, and at least a second even connecting structure formed in the terminal region for electrically connecting the second even terminals in the even layers.

According to another aspect of the present invention, a semiconductor capacitor is provided. The semiconductor capacitor includes a substrate, a first layer formed on the substrate, a second layer formed on the first layer, and a third layer formed on the second layer. The substrate includes a capacitor region, a terminal region, and a peripheral region defined thereon. The first layer includes a plurality of first fingers and a plurality of second fingers formed in the capacitor region. The first fingers and the second fingers are interdigitated with each other and physically and electrically isolated from each other in the capacitor region. The second layer includes a plurality of third fingers and a plurality of fourth fingers formed in the capacitor region. The third fingers and the fourth fingers are interdigitated with each other and physically and electrically isolated from each other in the capacitor region. The third layer includes a plurality of fifth fingers and a plurality of sixth fingers formed in the capacitor region. The fifth fingers and the sixth fingers are interdigitated with each other and physically and electrically isolated from each other in the capacitor region. The first fingers and the fifth fingers are electrically connected in the terminal region, the second fingers and the sixth fingers are electrically connected in the terminal region. The third fingers and the fourth fingers are electrically isolated from the first fingers, the second fingers, the fifth fingers, and the sixth fingers.

According to the semiconductor capacitor provided by the present invention, the fingers in adjacent layers are isolated from each other in the capacitor region. Consequently, the fingers in substrate-thickness direction are prevented from electromagnetic interaction, and thus adverse induction effects are avoided. More important, the terminals in adjacent layers are physically and electrically isolated from each other in the terminal region and thus no electrical interaction will be caused.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 1-3 are schematic drawings illustrating a semiconductor capacitor provided by a first and a second preferred embodiment of the present invention, wherein FIG. 1 is a schematic drawing illustrating a first layer of the semiconductor capacitor of the first and second preferred embodiments.

FIG. 2 is a schematic drawing illustrating a second layer of the semiconductor capacitor of the first and second preferred embodiments, and FIG. 3 is a schematic drawing illustrating a third layer of the semiconductor capacitor of the first and second preferred embodiments.

DETAILED DESCRIPTION

Figure 1:
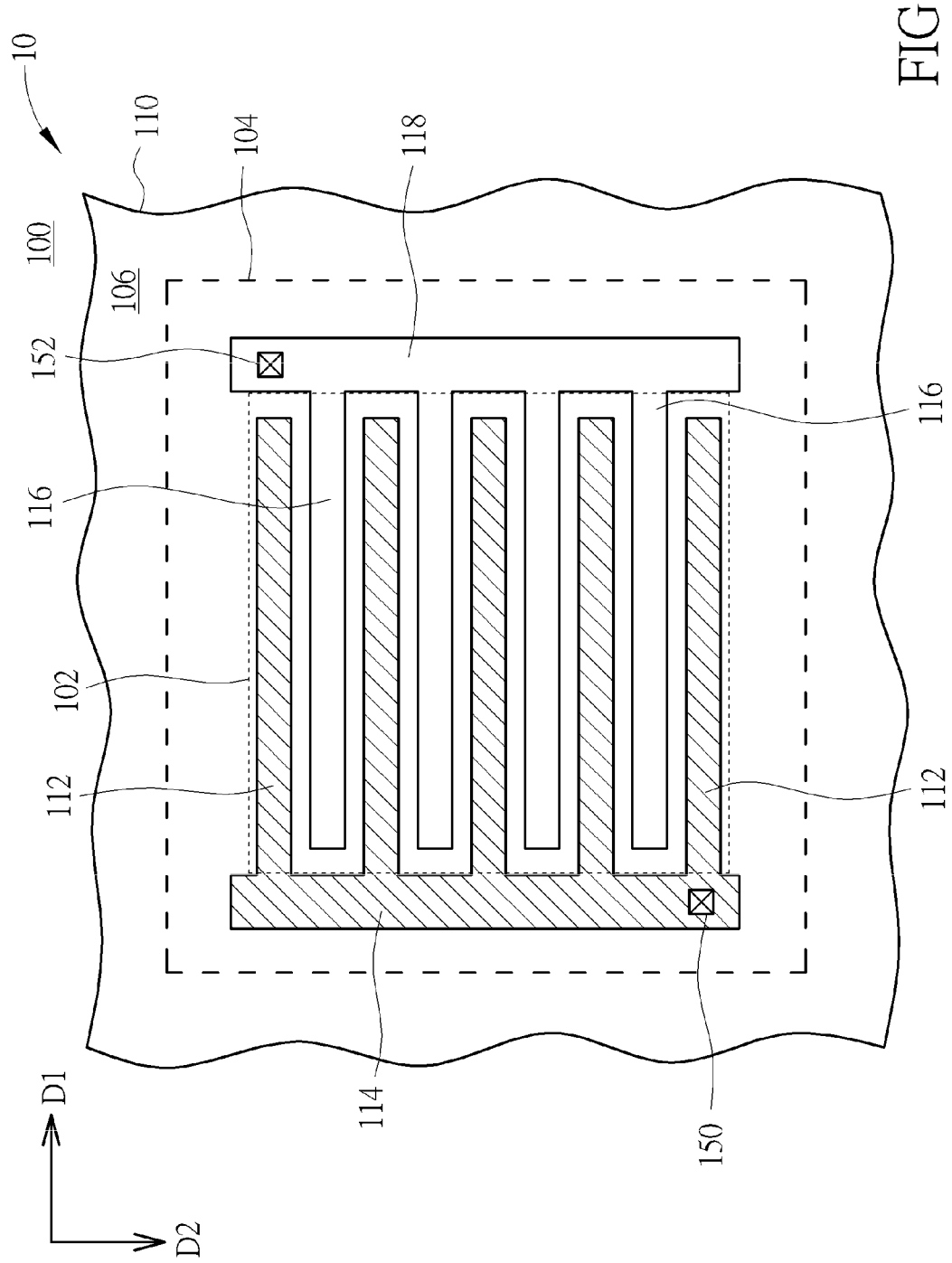
Figure 2:
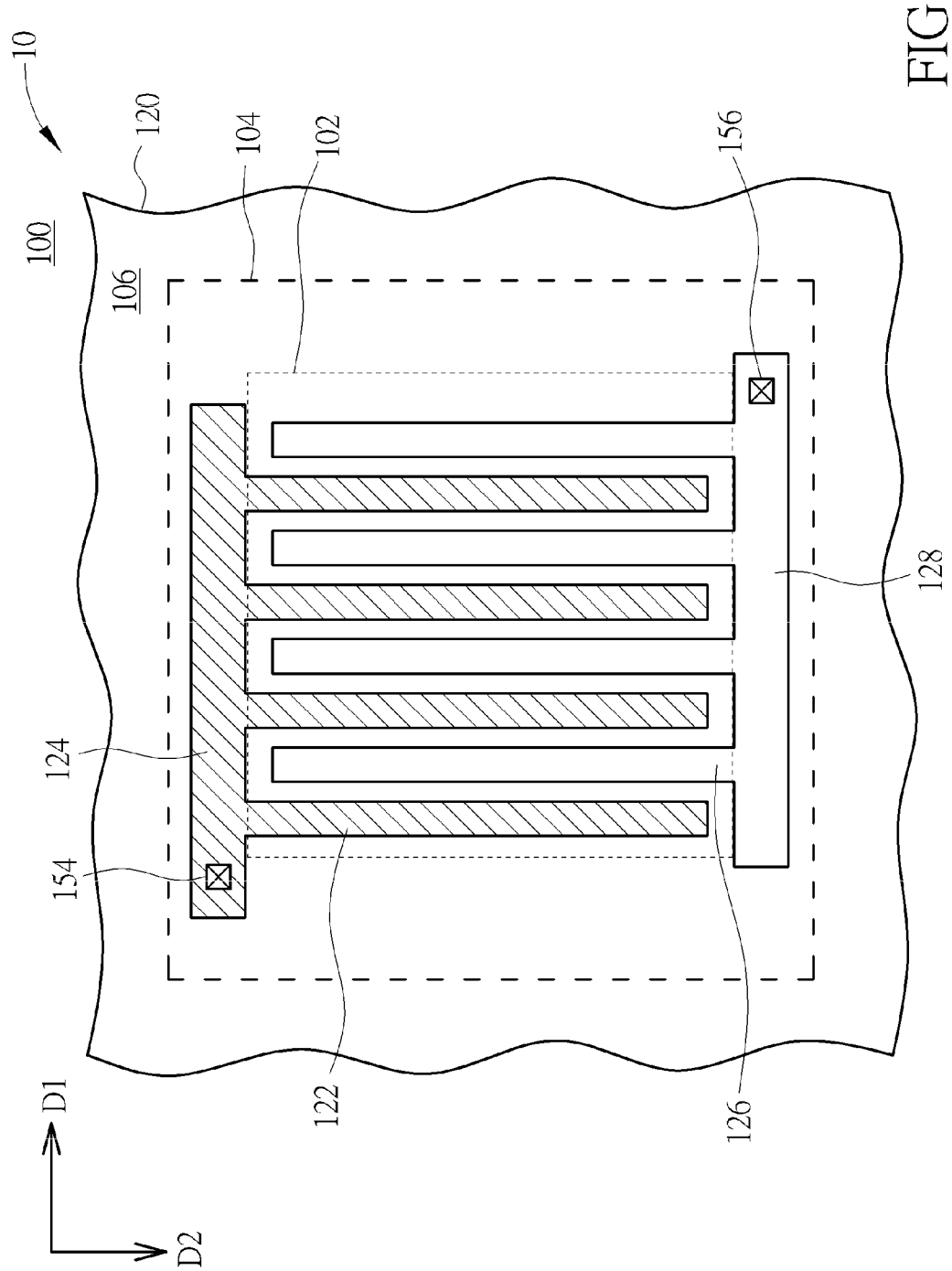
Figure 3:
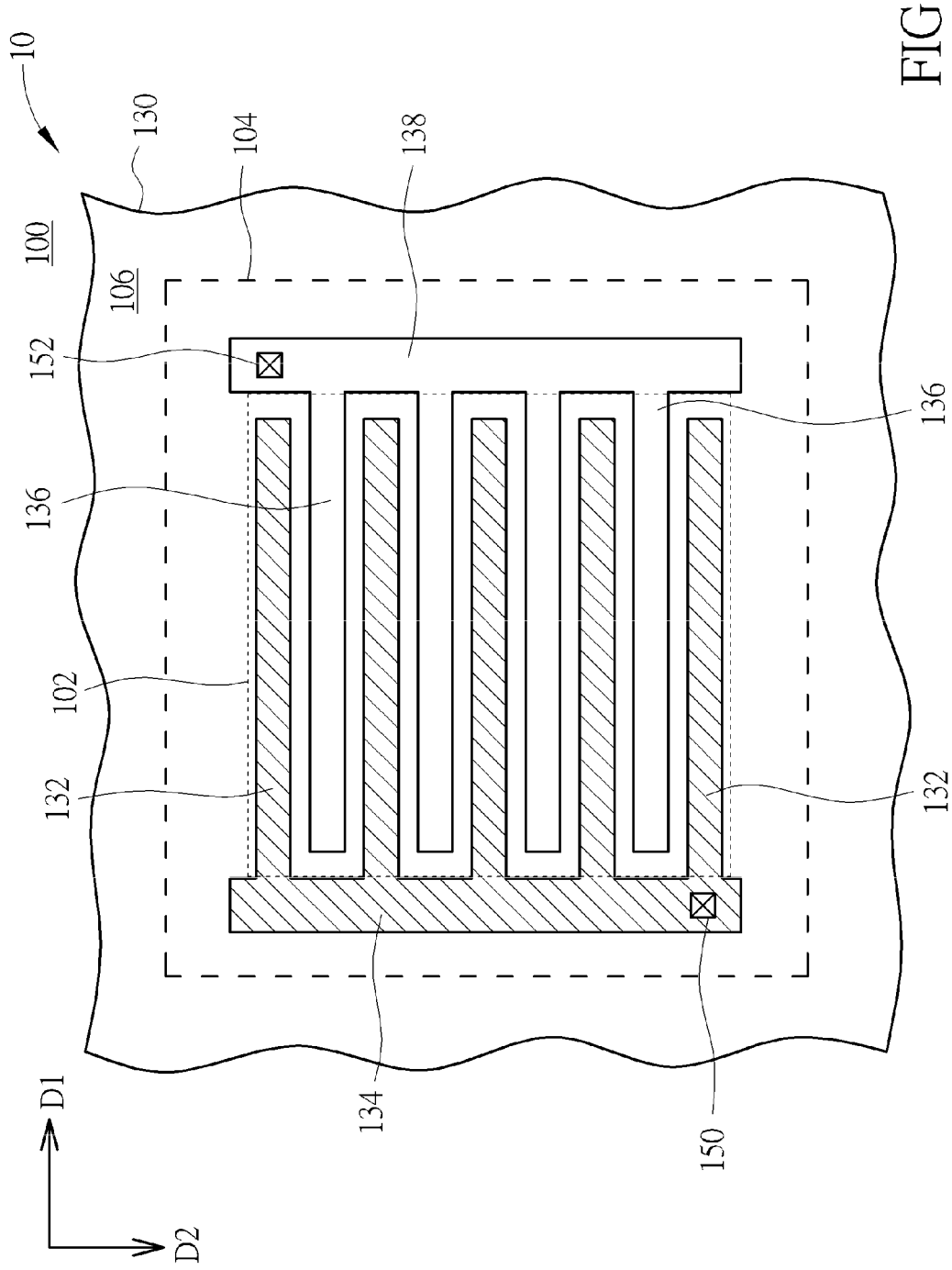

Please refer to FIGS. 1-3, which are schematic drawings illustrating a semiconductor capacitor provided by a first preferred embodiment of the present invention. As shown in FIG. 1, the semiconductor capacitor 10 includes a substrate 100. The substrate 100 includes a capacitor region 102, a terminal region 104, and a peripheral region 106 defined thereon. The capacitor region 102 is encompassed by the terminal region 104, while the terminal region 104 is encompassed by the peripheral region 106. A first layer 110 is formed on the substrate 100. Typically, the first layer 110 includes insulating materials for rendering electrical isolation. The first layer 110 inheritably includes the capacitor region 102, the terminal region 104, and the peripheral region 106 as shown in FIG. 1. A plurality of first fingers 112 and a plurality of second fingers 116 are formed in the first layer 110 in the capacitor region 102. It should be noted that amounts of the first fingers 112 and the second fingers 116 are arbitrary depending on different product requirements. As shown in FIG. 1, the first fingers 112 and the second fingers 116 extend along a first direction D1 and thus are parallel with each other in the substrate-horizontal direction. The first fingers 112 and the second fingers 116 are alternately arranged and thus are interdigitated. Furthermore, the first fingers 112 and the second fingers 116 are physically and electrically isolated from each other in the capacitor region 102.

Please still refer to FIG. 1. The first layer 110 further includes a first terminal 114 and a second terminal 118 formed therein. It is noteworthy that the first terminal 114 and the second terminal 118 are formed in the terminal region 104, particularly at two opposite sides related to the capacitor region 102 as shown in FIG. 1. Consequently, the first terminal 114 and the second terminal 118 are physically and electrically isolated from each other. The first terminal 114 and the second terminal 118 extend along a second direction D2, which is perpendicular to the first direction D1, and thus are parallel with each other in the substrate-horizontal direction. The first terminal 114 is perpendicular to the first fingers 112, and the first fingers 112 are all physically and electrically connected to the first terminal 114. In the same concept, the second terminal 118 is perpendicular to the second fingers 116, and the second fingers 116 are all physically and electrically connected to the second terminal 118.

Please refer to FIG. 2. A second layer 120 is formed on the first layer 110. Typically, the second layer 120 also includes insulating materials for rendering electrical isolation. The second layer 120 inheritably includes the capacitor region 102, the terminal region 104, and the peripheral region 106 as shown in FIG. 2. A plurality of third fingers 122 and a plurality of fourth fingers 126 are formed in the second layer 120 in the capacitor region 102. It should be noted that amounts of the third fingers 122 and the fourth fingers 126 are arbitrary depending on different product requirements. As shown in FIG. 2, the third fingers 122 and the fourth fingers 126 extend along the second direction D2 and thus are parallel with each other in the substrate-horizontal direction. Additionally, the third fingers 122 and the fourth fingers 126 are perpendicular to the first fingers 112 and the second fingers 116 in the substrate-horizontal direction. The third fingers 122 and the fourth fingers 126 are alternately arranged and thus are interdigitated. Furthermore, the third fingers 122 and the fourth fingers 126 are physically and electrically isolated from each other in the capacitor region 102.

Please still refer to FIG. 2. The second layer 120 further includes a third terminal 124 and a fourth terminal 128 formed therein. It is noteworthy that the third terminal 124 and the fourth terminal 128 are formed in the terminal region 104, particularly at another two opposite sides related to the capacitor region 102 as shown in FIG. 2. Consequently, the third terminal 124 and the fourth terminal 128 are physically and electrically isolated from each other. The third terminal 124 and the fourth terminal 128 extend along the first direction D1, and thus are parallel with each other in the substrate-horizontal direction. The third terminal 124 is perpendicular to the third fingers 122, and the third fingers 122 are all physically and electrically connected to the third terminal 124. In the same concept, the fourth terminal 128 is perpendicular to the fourth fingers 126, and the fourth fingers 126 are all physically and electrically connected to the fourth terminal 128.

Please refer to FIG. 3. A third layer 130 is formed on the second layer 120. Typically, the third layer 130 also includes insulating materials for rendering electrical isolation. The third layer 130 inheritably includes the capacitor region 102, the terminal region 104, and the peripheral region 106 as shown in FIG. 3. A plurality of fifth fingers 132 and a plurality of sixth fingers 136 are formed in the third layer 130 in the capacitor region 102. It should be noted that amounts of the fifth fingers 132 and the sixth fingers 136 are arbitrary depending on different product requirements. As shown in FIG. 3, the fifth fingers 132 and the sixth fingers 136 extend along the first direction D1 and thus are parallel with each other in the substrate-horizontal direction. The fifth fingers 132 and the sixth fingers 136 are alternately arranged and thus are interdigitated. Furthermore, the fifth fingers 132 and the sixth fingers 136 are physically and electrically isolated from each other in the capacitor region 102.

Please still refer to FIG. 3. The third layer 130 further includes a fifth terminal 134 and a sixth terminal 138 formed therein. It is noteworthy that the fifth terminal 134 and the sixth terminal 138 are formed in the terminal region 104, particularly at two opposite sides related to the capacitor region 102 as shown in FIG. 3. Comparing FIG. 3 with FIG. 1, it is obvious that the fifth terminal 134 and the first terminal 114 are on the same side, and the sixth terminal 138 and the second terminal 118 are on the same side. In other words, the first layer 110 and the third layer 130 include identical layout pattern in the preferred embodiment, but not limited to this. Consequently, the fifth terminal 134 and the sixth terminal 138 are physically and electrically isolated from each other. The third terminal 134 and the sixth terminal 138 extend along the second direction D2, and thus are parallel with each other in the substrate-horizontal direction. The fifth terminal 134 is perpendicular to the fifth fingers 132, and the fifth fingers 132 are all physically and electrically connected to the fifth terminal 134. In the same concept, the sixth terminal 138 is perpendicular to the sixth fingers 136, and the sixth fingers 136 are all physically and electrically connected to the sixth terminal 138.

Please refer to FIGS. 1-3 again. According to the semiconductor capacitor 10 provided by the preferred embodiment, the first fingers 112, the second fingers 116, the fifth fingers 132, and the sixth fingers 136 are parallel with each other in the substrate-horizontal direction. And the third fingers 122 and the fourth fingers 126 are perpendicular to the first fingers 112, the second fingers 116, the fifth fingers 132, and the sixth fingers 136.

Furthermore, according to the first preferred embodiment, the semiconductor capacitor 10 further includes at least a first connecting structure 150 formed in the terminal region 104 for electrically connecting the first terminal 114 in the first layer 110 and the fifth terminal 134 in the third layer 130 and thus the first fingers 112 and the fifth fingers 132 are electrically connected in the terminal region 104. In the same concept, at least a second connecting structure 152 is formed in the terminal region 104 for electrically connecting the second terminal 118 in the first layer 110 and the sixth terminal 138 in the third layer 130, and thus the second fingers 116 and the sixth fingers 136 are electrically connected in the terminal region 104. However, the first terminal 114 and the fifth terminal 134 in the terminal region 104 are physically and electrically isolated from the third terminal 124 in the second layer 120, and the second terminal 118 and the sixth terminal 138 in the terminal region 104 are physically and electrically isolated from the fourth terminal 128 in the second layer 120. Additionally, a third connecting structure 154 is formed in the third terminal 124 in the terminal region 104 for providing electrical connection to outer electrical source, and a fourth connecting structure 156 is formed in the fourth terminal 128 in the terminal region 104 for providing electrical connection to outer electrical source.

It should be noted that amounts of the first connecting structure 150, the second connecting structure 152, the third connecting structure 154 and the fourth connecting structure 156 are arbitrary depending on different product requirements. For example, there can be a plurality of first connecting structures 150 disposed along the first terminal 114 and the fifth terminal 134. In the same concept, there can be a plurality of second connecting structures 152 disposed along the second terminal 118 and the sixth terminal 138, a plurality of third connecting structures 154 disposed along the third terminal 124, and a plurality of fourth connecting structures 156 disposed along the fourth terminal 128.

More important, the first fingers 112 and the fifth fingers 132 are electrically connected to a first electrode A (shown in FIG. 5) formed in the peripheral region 106. The third fingers 122 are also electrically connected to the first electrode A. In other words, the first terminal 114 and the fifth terminal 134 are electrically connected to the first electrode A in the peripheral region 106 by a wiring line while the third terminal 124 is electrically connected to the first electrode A in the peripheral region 106 by another wiring line. The second fingers 116 and the sixth fingers 136 are electrically connected to a second electrode B formed in the peripheral region 106. In the same concept, the fourth fingers 126 are also electrically connected to the second electrode B. In other words, the second terminal 118 and the sixth terminal 138 are electrically connected to the second electrode B in the peripheral region 106 by another wiring line while the fourth terminal 128 is electrically connected to the second electrode B in the peripheral region 106 by still another wiring line. Consequently, the semiconductor capacitor 10 having insulating material sandwiched between two different conductors is constructed.

Additionally, in a modification to the preferred embodiment, the first fingers 112 to the sixth fingers 136 in adjacent layers 110/120/130 are all electrically isolated in the capacitor region 102. The first fingers 112 to the sixth fingers 136 can be electrically connected to different electrodes by different wiring layers, depending on the product requirements.

Furthermore, the first fingers 112 and the second fingers 116 include a first material while the third fingers 122, the fourth fingers 126, the fifth fingers 132, and the sixth fingers 136 include a second material. In the preferred embodiment, the first material and the second material can be identical. For example, when the first fingers 112 to the sixth fingers 136, the first terminal 114 to the sixth terminal 138, and the first connecting structure 150 to the fourth connecting structure 156 are all formed by interconnection process, the first material and the second material include the same metal material such as Cu or W, but not limited to this. In a modification to the preferred embodiment, the first material and the second material can be different. For example, when the first layer 110 includes other devices for constructing IC, the first material can include polysilicon while the second material can include metal material.

According to the semiconductor capacitor 10 provided by the first preferred embodiment, the semiconductor capacitor 10 include a "woven" structure as a series of metal lines that alternate in voltage both horizontally (within a layer) and vertically (between layers). This woven structure has electric field lines with both horizontal and vertical components, and thus higher capacitance density is easily achieved.

Please refer to FIGS. 1-5, which are schematic drawings illustrating a semiconductor capacitor provided by a second preferred embodiment of the present invention. It should be noted that elements the same in both of the first and second preferred embodiments are designated by the same numerals, and thus those details are omitted in the interest of brevity. More important, the semiconductor capacitor 10 provided by the second preferred embodiment includes a first layer 110, a second layer 120, and a third layer 130 the same with those mentioned above, thus those details are omitted for simplicity. The difference between the first preferred embodiment and second preferred embodiment is: The semiconductor capacitor 10 provided by the second preferred embodiment further includes a fourth layer 140.

Figure 4:
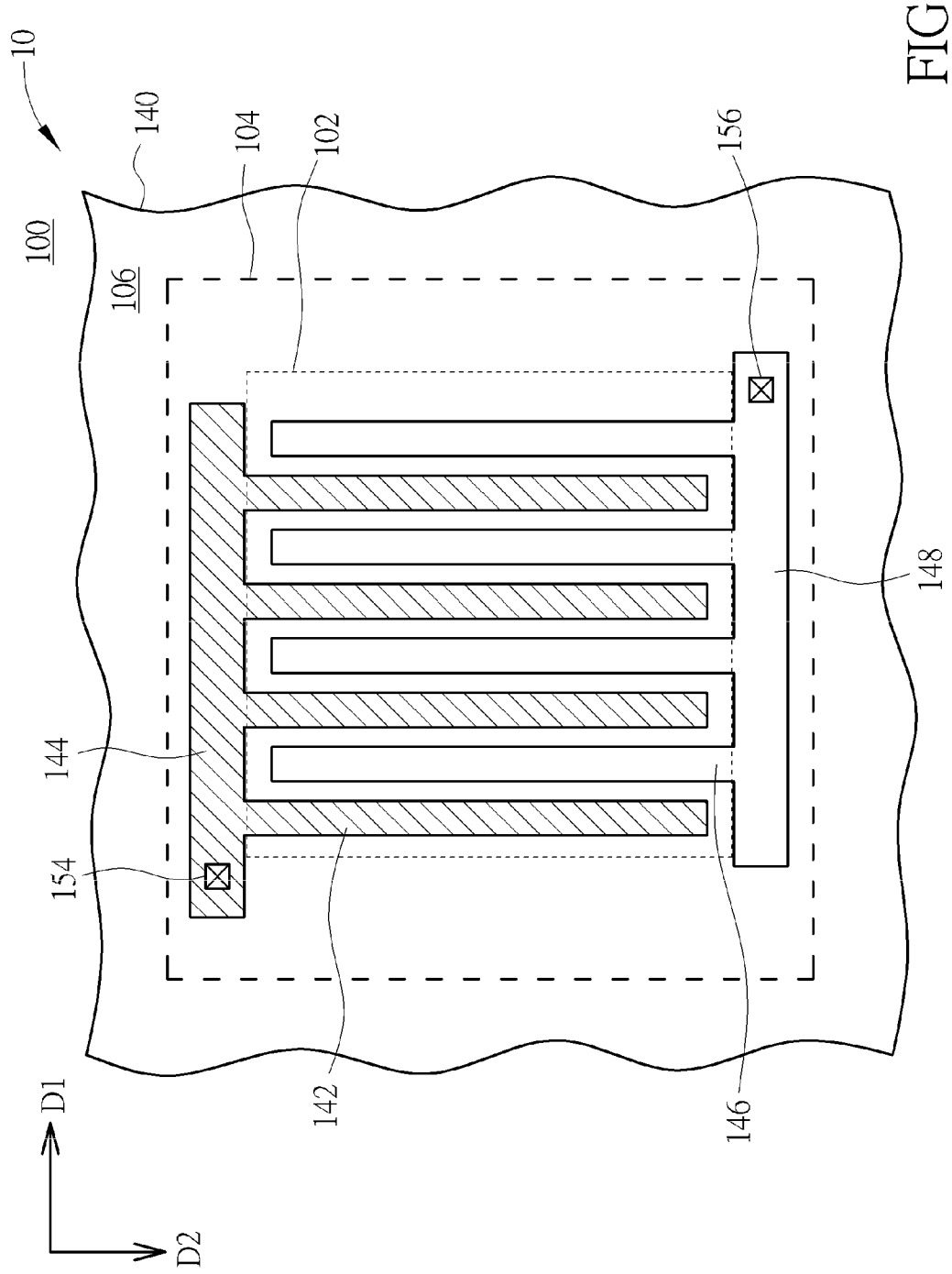
FIG. 4 is a schematic drawing illustrating a fourth layer of the semiconductor capacitor of the second preferred embodiment.

Please refer to FIG. 4. The fourth layer 140 is formed on the third layer 130. Typically, the fourth layer 140 also includes insulating materials for rendering electrical isolation. The fourth layer 140 inheritably includes the capacitor region 102, the terminal region 104, and the peripheral region 106 as shown in FIG. 4. A plurality of seventh fingers 142 and a plurality of eighth fingers 146 are formed in the fourth layer 140 in the capacitor region 102. It should be noted that amounts of the seventh fingers 142 and the eighth fingers 146 are arbitrary depending on different product requirements. As shown in FIG. 4, the seventh fingers 142 and the eighth fingers 146 extend along the second direction D2 and thus are parallel with each other in the substrate-horizontal direction. The seventh fingers 142 and the eighth fingers 146 are alternately arranged and thus are interdigitated. Furthermore, the seventh fingers 142 and the eighth fingers 146 are physically and electrically isolated from each other in the capacitor region 102.

Please still refer to FIG. 4. The fourth layer 140 further includes a seventh terminal 144 and an eighth terminal 148 formed therein. It is noteworthy that the seventh terminal 144 and the eighth terminal 148 are formed in the terminal region 104, particularly at another two opposite sides related to the capacitor region 102 as shown in FIG. 4. Comparing FIG. 4 with FIG. 2, it is obvious that the seventh terminal 144 and the third terminal 124 are on the same side, and the eight terminal 148 and the fourth terminal 128 are on the same side. Consequently, the seventh terminal 144 and the eighth terminal 148, which are physically and electrically isolated from each other, are not involved in any electromagnetic induction due to this arrangement. The seventh terminal 144 and the eighth terminal 148 extend along the first direction D1, and thus are parallel with each other in the substrate-horizontal direction. The seventh terminal 144 is perpendicular to the seventh fingers 142, and the seventh fingers 142 are all physically and electrically connected to the seventh terminal 144. In the same concept, the eighth terminal 148 is perpendicular to the eighth fingers 146, and the eighth fingers 146 are all physically and electrically connected to the eighth terminal 148. Therefore, the second layer 120 and the fourth layer 140 include identical layout pattern in accordance with the preferred embodiment, but not limited to this.

Please refer to FIGS. 2 and 4. According to the second preferred embodiment, the semiconductor capacitor 10 further includes at least a third connecting structure 154 formed in the terminal region 104 for electrically connecting the third terminal 124 in the second layer 120 and the seventh terminal 144 in the fourth layer 140, and thus the third fingers 122 and the seventh fingers 142 are electrically connected in the terminal region 104. In the same concept, at least a fourth connecting structure 156 is formed in the terminal region 104 for electrically connecting the fourth terminal 128 in the second layer 120 and the eighth terminal 148 in the fourth layer 140, and thus the fourth fingers 126 and the eighth fingers 146 are electrically connected in the terminal region 104. As mentioned above, the amounts and arrangements of the connecting structures 150/152/154/156 can be adjusted depending on different product requirements, and those details are omitted herein for simplicity.

Figure 5:
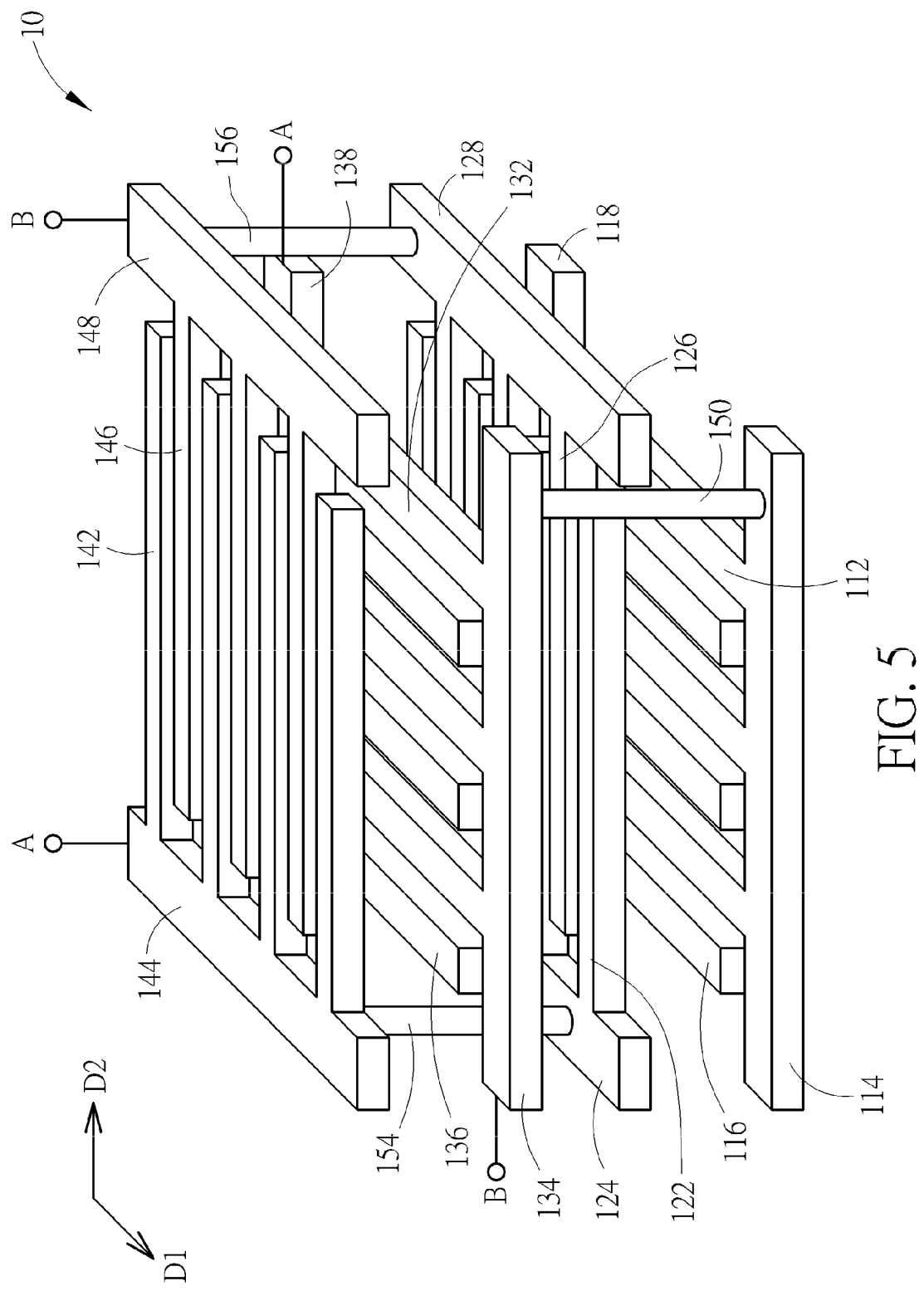
FIG. 5 is a schematic drawing illustrating the semiconductor capacitors provided by the second preferred embodiments.

Please refer to FIG. 5. It should be understood that for clarifying spatial relationship between fingers, terminals, and connecting structures, the insulating material and the substrate 100 are omitted from FIG. 5. According to the preferred embodiment, the first fingers 112, the third fingers 122, the fifth fingers 132, and the seventh fingers 142 are electrically connected to a first electrode A formed in the peripheral region 106 while the second fingers 116, the fourth fingers 126, the sixth fingers 136, and the eighth fingers 146 are electrically connected to a second electrode B formed in the peripheral region 106. In other words, the first terminal 114, the third terminal, 124, the fifth terminal 134, and the seventh terminal 144 are electrically connected to the first electrode A in the peripheral region 106 by another wiring lines, and the second terminal 118, the fourth terminal 128, the sixth terminal 138, and the eighth terminal 140 are electrically connected to the second electrode B in the peripheral region 106 by still another wiring lines. Consequently, the semiconductor capacitor 10 having insulating material sandwiched between two different conductors is constructed.

Additionally, in a modification to the preferred embodiment the first fingers 112 to the eighth fingers 146 in adjacent layers 110/120/130/140 are all electrically isolated in the capacitor region 102. The first fingers 112 to the eighth fingers 146 can be electrically connected to different electrodes by different wiring layers, depending on the product requirements.

According to the semiconductor capacitor 10 provided by the second preferred embodiment, the semiconductor capacitor 10 include a "woven" structure as a series of metal lines that alternate in voltage both horizontally (within a layer) and vertically (between layers). This woven structure has electric field lines with both horizontal and vertical components, and thus higher capacitance density is easily achieved.

Additionally, it should be noted that while example shown in FIG. 5 has only four layers for constructing the semiconductor capacitor 10, it is to be understood, that the structure can be extended vertically over the substrate 100 if required. Accordingly, the semiconductor capacitor 10 provided by the present invention includes a plurality of odd layers 110/130 and a plurality of even layers 120/140 alternately formed on the substrate 100. Each odd layer 110/130 includes a plurality of first odd fingers 112/132 and a plurality of second odd fingers 116/136 formed in the capacitor region 102. The first odd finger 112/132 and the second odd fingers 116/136 are interdigitated and physically and electrically isolated from each other in the capacitor region 102. Each odd layer 110/130 further includes a first odd terminal 114/134 and a second odd terminal 118/138 formed in the terminal region 104. The first odd fingers 112/132 are electrically connected to the first odd terminals 114/134 and the second odd fingers 116/136 are electrically connected to the second odd terminals 118/138. More important, the semiconductor capacitor 10 includes at least a first odd connecting structure 150 and at least a second odd connecting structure 152 formed in the terminal region 102. As shown in FIG. 5, the first odd connecting structure 150 electrically connects the first odd terminals 114/134 in the odd layers 110/130, and the second odd connecting structure 152 electrically connects the second odd terminals 118/138 in the odd layers 110/130. Each even layer 120/140 includes a plurality of first even fingers 122/142 and a plurality of second even fingers 126/146 formed in the capacitor region 102. The first even fingers 122/142 and the second even fingers 126/146 are interdigitated and physically and electrically isolated from each other in the capacitor region 102. Each even layer 120/140 further includes a first even terminal 124/144 and a second even terminal 128/148 formed in the terminal region 104. The first even fingers 122/142 are electrically connected to the first even terminal 124/144 and the second even fingers 126/146 are electrically connected to the second even terminal 128/148. More important, the semiconductor capacitor 10 includes at least a first even connecting structure 154 and at least a second even connecting structure 156 formed in the terminal region 102. As shown in FIG. 5, the first even connecting structure 154 electrically connects the first even terminals 124/144 in the even layers 120/140, and the second even connecting structure 156 electrically connects the second even terminals 128/148 in the even layers 120/140.

Since the extending directions and other details of the fingers and the terminals, and the amounts and arrangements of the connecting structures are the same with those described above, those details are omitted for simplicity.

Please still refer to FIG. 5. According to the semiconductor capacitor 10 provided by the present invention, the first odd terminals 114/134 and the first even terminals 124/144 are electrically connected to the first electrode A formed in the peripheral region 106 by another wiring lines, and the second odd terminals 118/138 and the second even terminals 128/148 are electrically connected to the second electrode B formed in the peripheral region 106 by still another wiring lines. Consequently, the semiconductor capacitor 10 having insulating material sandwiched between two different conductors is constructed.

According to the semiconductor capacitor 10 provided by the present invention, the semiconductor capacitor 10 include a "woven" structure as a series of metal lines that alternate in voltage both horizontally (within a layer) and vertically (between layers). This woven structure has electric field lines with both horizontal and vertical components, and thus higher capacitance density is easily achieved. More important, since there is not any connecting structure formed between the terminals 114/118/134/138 in the odd layers 110/130 and the terminals 124/128/144/148 in the even layer 120/140, terminals 114/118/134/138 in the odd layers 110/130 are physically isolated from the terminals 124/128/144/148 in the even layer 120/140. In other words, the terminals in adjacent layers are physically isolated from each other and thus no electrical interaction will be caused.

Briefly speaking, no direct connecting structure is rendered to the conductive materials in adjacent layers in the semiconductor capacitor. Accordingly, the fingers in adjacent layers are physically isolated in the capacitor region and terminals in adjacent layers are physically isolated from each other in the terminal region, therefore electromagnetic interaction and undesirable induction effects between the conductive material in the adjacent layer are prevented.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor capacitor comprising:
    a substrate having a capacitor region, a terminal region, and a peripheral region defined thereon;

a first layer formed on the substrate, the first layer comprising:
  a plurality of first fingers formed in the capacitor region; and
  a plurality of second fingers formed in the capacitor region, the first fingers and the second fingers being interdigitated and physically and electrically isolated from each other in the capacitor region;
a second layer formed on the first layer, the second layer comprising:
  a plurality of third fingers formed in the capacitor region; and
  a plurality of fourth fingers formed in the capacitor region, the third fingers and the fourth fingers being interdigitated and physically and electrically isolated from each other in the capacitor region; and
a third layer formed on the second layer, the third layer comprising:
  a plurality of fifth fingers formed in the capacitor region; and
  a plurality of sixth fingers formed in the capacitor region, the fifth fingers and the sixth fingers being interdigitated and physically and electrically isolated from each other in the capacitor region,
wherein the first fingers and the fifth fingers are electrically connected in the terminal region, the second fingers and the sixth fingers are electrically connected in the terminal region, and the third fingers and the fourth fingers are electrically isolated from the first fingers, the second fingers, the fifth fingers, and the sixth fingers.

2. The semiconductor capacitor according to claim 1, wherein the first fingers, the second fingers, the fifth fingers, and the sixth fingers are parallel with each other.

3. The semiconductor capacitor according to claim 2, wherein the third fingers and the fourth fingers are perpendicular to the first fingers, the second fingers, the fifth fingers, and the sixth fingers.

4. The semiconductor capacitor according to claim 1, wherein the first fingers, the third fingers, and the fifth fingers are electrically connected to a first electrode formed in the peripheral region.

5. The semiconductor capacitor according to claim 4, wherein the second fingers, the fourth fingers, and the sixth fingers are electrically connected to a second electrode formed in the peripheral region.

6. The semiconductor capacitor according to claim 1, wherein the first fingers and the second fingers comprise a first material, and the third fingers, the fourth fingers, the fifth fingers, and the sixth fingers comprise a second material.

7. The semiconductor capacitor according to claim 6, wherein the first material and the second material are identical.

8. The semiconductor capacitor according to claim 6, wherein the first material and the second material are different.

* * * * *